United States Patent [19]
Tylko

[11] Patent Number: 5,824,988
[45] Date of Patent: Oct. 20, 1998

[54] REACTOR AND METHOD FOR THE TREATMENT OF PARTICULATE MATTER BY ELECTRICAL DISCHARGE

[76] Inventor: Jozef K. Tylko, 523 SE. 7th St., Minneapolis, Minn. 55414

[21] Appl. No.: 905,195

[22] Filed: Aug. 1, 1997

Related U.S. Application Data

[63] Continuation of Ser. No. 701,034, Aug. 21, 1996, abandoned, which is a continuation of Ser. No. 488,078, Jun. 7, 1995, abandoned, which is a continuation of Ser. No. 248,701, May 24, 1994, abandoned, which is a continuation of Ser. No. 109,606, Aug. 19, 1993, Pat. No. 5,403,991.

[51] Int. Cl.$^6$ .................................................. B23K 10/00
[52] U.S. Cl. .............................. 219/121.36; 219/121.57; 219/121.54; 219/121.37; 373/18
[58] Field of Search ...................... 219/121.36, 121.37, 219/121.38, 121.48, 121.52, 121.57, 12.54, 121.59, 121.39; 373/18–22

[56] References Cited

U.S. PATENT DOCUMENTS 4,361,441  11/1982  Tylko ...................................... 75/10 R

*Primary Examiner*—Mark H. Paschall
*Attorney, Agent, or Firm*—Nawrocki, Rooney & Sivertson, P.A.

[57] ABSTRACT

A reactor and method for the treatment of matter by plasma action. A plurality of electrode structures are positioned to define a reaction zone associated with the inter-electrode space. The inter-electrode space is conditioned (as by preionizing) and a series of discrete electrical discharges are produced throughout the reaction zone. In a preferred embodiment, the reaction zone is subjected to a sequence of discrete electrical discharges in a time interval less than the residence time of material to be treated within the reaction zone.

1 Claim, 5 Drawing Sheets

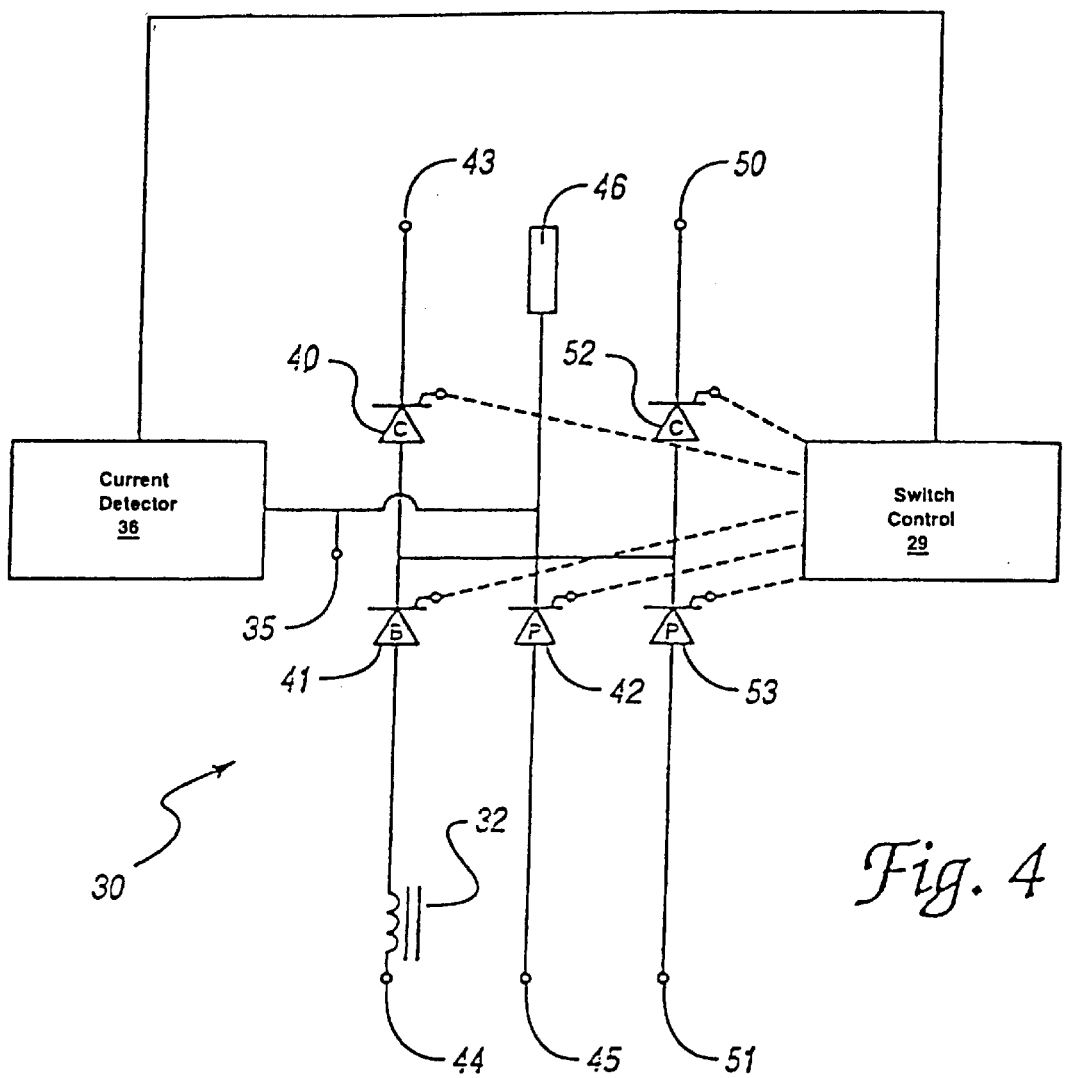

5,824,988

REACTOR AND METHOD FOR THE TREATMENT OF PARTICULATE MATTER BY ELECTRICAL DISCHARGE

This application is continuation of U.S. application Ser. No. 08/701,034 now abandoned, which is a continuation of U.S. application Ser. No. 08/488,078, filed Jun. 7, 1995 now abandoned, which is a continuation of U.S. application Ser. No. 08/248,701, filed May 24, 1994 now abandoned, which is a continuation of U.S. application Ser. No. 08/109,606, filed Aug. 19, 1993, now U.S. Pat. No. 5,403,991.

BACKGROUND OF THE INVENTION

The present invention relates generally to the treatment of matter by interaction with plasma and, in particular, to a reactor and method for effecting such treatment via discrete electrical discharges.

The relatively high energy levels available from plasma have recognized value in the processing of many particulate materials. Typical known methods of generating plasma have relied on the conversion of electric current into high temperature effluents of one kind or another which, by virtue of their high temperature and enthalpy, interact with the feedstocks, bringing about a higher rate of reaction than would take place at a low temperature. Most conventional methods of producing low temperature plasma, plasma torches ("plasmatrons"), for example, have not proven industrially useful for the treatment of tonnage quantities of particulate matter, in themselves.

The difficulties encountered in the treatment of particulate materials with low temperature plasmas are discussed in U.S. Pat. No. 4,361,441 issued Nov. 30, 1982 in the name of Jozef K. Tylko, one of the co-inventors herein, which patent is hereby incorporated by reference. The expression "low temperature plasma" as defined in the incorporated patent is an arbitrary reference to plasmas having an ion temperature below 100,000° K. That convention is retained herein. Further, the term "particulate matter," as used herein, includes solid particles as well as fluids (gases or liquids), and combinations or mixtures thereof.

As described in the incorporated patent, the industrial application of low temperature plasma technology has developed along two different routes. The first route (in which the volume of the arc discharge was not used for entrainment of feed stocks) chiefly utilized the point of impingement of the arc at the anode and behaved in this respect very much like electric arc furnaces. The second route, more relevant to the present invention, aims at the treatment of particles in the whole volume of the plasma produced--treatment "in flight." For this purpose, it was required to expand the plasma and this involves increasing its original volume. This is the development of Jozef K. Tylko, one of the co-inventors herein.

Two distinct methods for plasma expansion are discussed in the incorporated patent. It should be noted that both of these methods involve the establishment and maintenance of an expanded plasma volume. The more relevant of these methods to an understanding of the present invention is initially disclosed in British Patent Nos. 1,390,351-3. In this method, a plasma torch acting as a cathode was made to orbit in a circular path and at a small angle with the vertical, projecting the arc to a downstream annular electrode. A truncated conical plasma region was defined by the orbiting arc discharge. This method served well as a laboratory plasma furnace for studying many reactions. However, mechanical limitations resulting from the need to orbit the torch severely limited the industrial utility of this method.

The method of the incorporated patent addressed many of the limitations of the orbiting torch technology discussed above. In this methodology, an arc discharge was generated between stationary electrode structures, at least one of those structures being annular. As indicated in the incorporated patent, a primary requirement of the system was the establishment and maintenance of an expanded plasma within the reaction zone between the electrode structures. Early versions of the methodology of the incorporated patent also required utilization of a plasmatron. Later versions utilized a simple electrode structure as the central cathode while maintaining an annular ring structure for the anode, the annular anode being formed by multiple anode segments. Such a system is discussed in a thesis prepared by Steven Anthony Vrchota in partial fulfillment of the requirements of a degree of Masters of Science at the University of Minnesota dated April, 1991 and entitled *Use of the Sustained Shock Wave Reactor for the Recovery of Metals From Electric Arc Furnace Dust.*

The method of the incorporated patent allowed a heavier loading of matter to be treated while taking advantage of an apparently anomalous behavior of at least some matter in such plasmas. It was concluded that the presence of a dense suspension of particles in the plasma zone increased the effective energy flux causing rapid plasma-solid interactions. It was noted that these interactions need not be purely thermal and, indeed, that the method of the incorporated patent utilized these non-thermal (anomalous) phenomena.

As indicated above, the difficulty in these prior art methods is maintenance of the plasma-forming arc discharge. Generally, as the quantity of matter introduced into the expanded plasma increased, the likelihood of extinction of the arc increased. Extinction of the arc stops the processing, with many attendant problems. This difficulty was addressed in the incorporated patent by the utilization of a rapidly fluctuating potential difference between the cathode and the anode electrode structures while that discharge was circulating about the periphery of the annular electrode structure (anode). However, maintaining the plasma at industrially significant feedstock loading remained a problem. A pattern of least energy configuration would be established. Also, significant loading volumes remained a problem in themselves, in that not all particles were treated.

In summary, the method of the incorporated patent resolved the mechanical limitations in the prior art by orbiting the arc by non-mechanical means whereby rapid rates of "rotation" far greater than those possible by mechanical means were attained. Additionally, pulsation of the arc by rapid changes in the applied power established conditions which improved the ability to maintain the arc discharge while also utilizing non-thermal phenomena which enhance the plasma action on the matter being treated. However, the perceived need to maintain the arc discharge orbiting around the annular electrode structure significantly limited the industrial utility of the method. Also, significant loading volumes remained a problem. During operation, a pattern of least energy configuration was established. As a result, particles were not uniformly treated.

SUMMARY OF THE INVENTION

The present invention provides the advantages of the method of the incorporated patent while dispensing with the need to maintain an orbiting arc discharge. Instead, a series of discrete electrical discharges are utilized in a treatment or reaction zone defined by spaced electrode structures, the treatment zone containing large amounts of particles to be treated and the discharges acting on these particles "in flight." As described herein, these discharges may be sequential in time, but need not be sequential in space and may overlap in time and space and may be simultaneous. Thus, the criticality of maintaining a sequential orbiting discharge is eliminated.

As noted in the incorporated patent, the presence of a dense suspension of particles in the treatment zone increases the effective energy flux while utilizing non-thermal phenomena first recognized in the method of the incorporated patent. In particular, it is believed that these non-thermal phenomena are the result of the formation of "microfields" in which very high local potential differences and other associated fluctuating anomalies occur. These high local potential differences and associated anomalies appear to have a pronounced effect on the particles being treated, such as the imposition of electrical and mechanical stresses, assisting disruption and causing polarization, increased ionization, and interaction with solid state effects. Effects of this character are essentially primarily non-thermal and reside in the microscopic mechanisms of plasmas. As noted in the incorporated patent, they have been observed but have hitherto been dependent upon the establishment and maintenance of a sufficiently stable plasma for their economic utilization.

It is recognized that the model presented herein is highly simplified but does describe the basic mechanism which is believed to be operating within the present invention while pointing out the primary distinction between the present invention and the prior art—the necessity in the prior art of establishing and maintaining a stable expanded plasma. In a basic preferred embodiment in accordance with the present invention, a reactor is provided having spaced electrode structures defining a treatment zone. The treatment zone is preionized in any desired manner and discrete electrical discharges are produced throughout the treatment zone. The discrete electrical discharges are produced in a desired sequence and in a time interval less than, and preferably considerably less than, the transit time of the matter to be treated through the treatment zone. In a particularly preferred embodiment, and with any given electrode configuration, one or more of the electrode structures may alternatively function as anode or cathode. That is, the electrode structures, in accordance with the present invention may operate with a variable polarity. While this variable polarity, in itself, is an important feature of the present invention, it also highlights an essential difference between the present invention and the prior art. That is, an electrode utilized in the described prior art devices for the establishment and maintenance of an expanded plasma within the inter-electrode space must maintain its polarity for maintenance of the expanded plasma.

In addition to a reactor, the present invention provides a method for the treatment of matter by electrical discharge including the steps of positioning the plurality of electrode structures, to define a desired inter-electrode space or spaces, conditioning the inter-electrode space as by preionizing that space in any desired manner, introducing particulate matter to be treated to the inter-electrode space and producing a plurality of discrete electrical discharges in a desired sequence between said electrode structures. In accordance with this method, substantially the entire inter-electrode space is subjected to discrete electrical discharges within a time interval less than the expected residence time of a particle to be treated within the inter-electrode space.

In a specific preferred embodiment, a conical treatment zone is established by a central cathode and a plurality of circularly disposed anodes longitudinally displaced from the central cathode. While superficially similar to the disclosed embodiment in the incorporated patent, the structure may be differentiated. In particular, an arc discharge need not "orbit" about an annular anode electrode structure. Instead, in accordance with the present invention, a series of discrete electric discharges may sequentially move along circularly disposed anode structures. Additionally, any or all of such circularly disposed electrode structures may function as a cathode—clearly differentiating the present invention from that of the incorporated patent.

Any number of distinct electrode configurations may be employed in accordance with the particular application. Further, it is contemplated that the present invention may be utilized in the disposal of wastes (solid, liquid, or gaseous, or combinations thereof) in the production of glasses or in the synthesis of compounds or other chemical or physical reactions. The reactor may be operated over a wide range of pressures (from below to above atmospheric pressure) and over a variety of regimes (reducing, oxidizing or neutral).

BRIEF DESCRIPTION OF THE DRAWINGS

FIG. 4 is a schematic diagram illustrating a modification to a portion of the circuit of FIG. 3;

FIG. 6 is a table showing the on/off states of the power switches of FIG. 3 during part of an operating sequence.

DETAILED DESCRIPTION OF THE INVENTION

Figure 1:
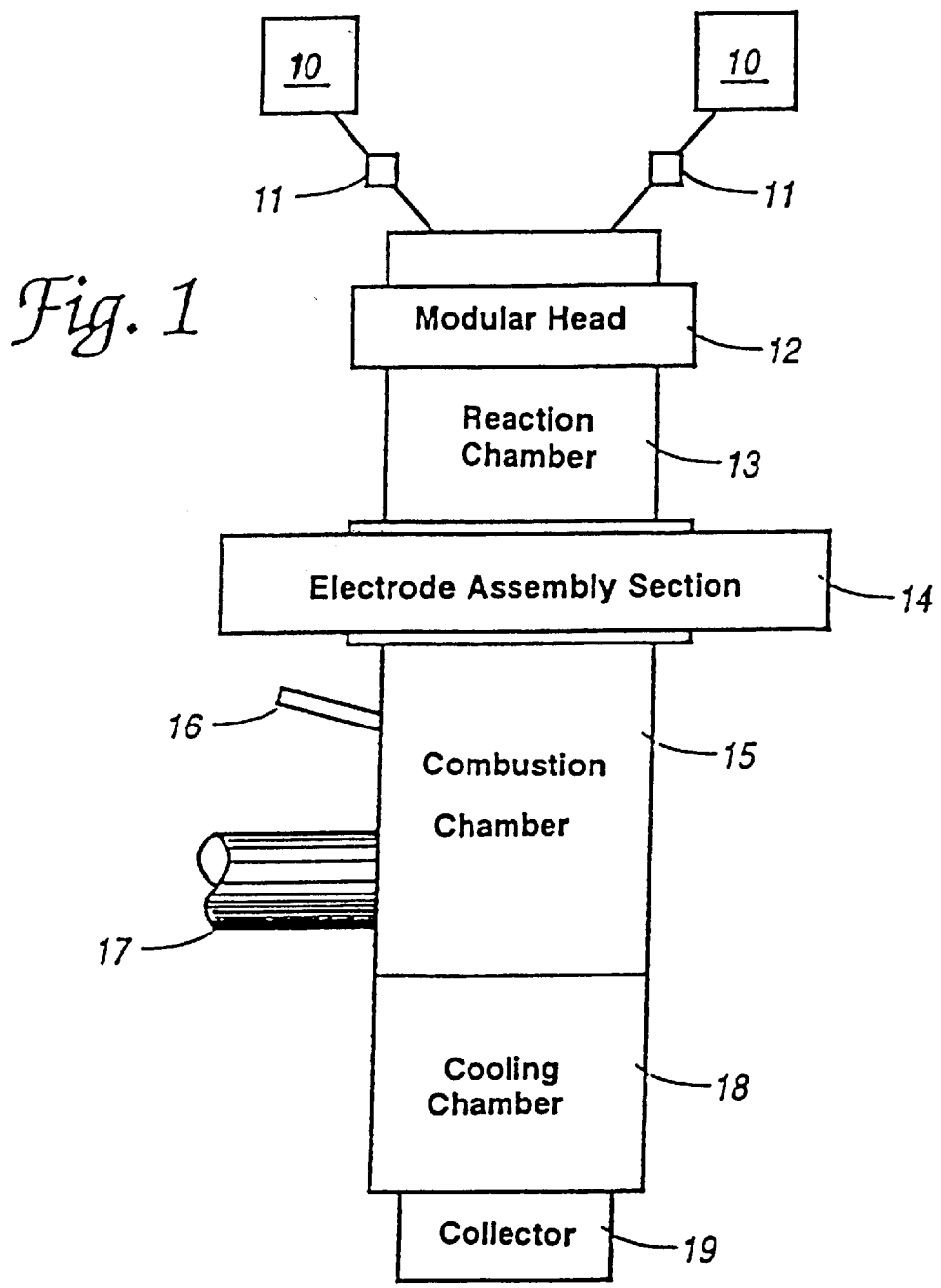
FIG. 1 is a schematic elevational view of a reactor according to the present invention.

FIG. 1 is a diagrammatic illustration of a reactor in accordance with the present invention which incorporates many elements know to the prior art and which may be utilized in the practice of the invention herein. In the reactor of FIG. 1, feedstock dispensers 10 are connected through electrostatic charging probes 11 to a modular head 12 which also receives gas for forming a plasma, coolant, and electrical supplies for the start-up electrode. Downstream of the plasma head 12 is a reaction chamber 13 and electrode assembly section 14. The remaining portions of the reactor FIG. 1 are application specific and are utilized, for example, if the reactor is to be used for energy recovery and include a combustion chamber 15 immediately below the electrode section 14 to which controlled quantities of air are injected, at 16, for example, to cause combustion of carbon value separated in the reactor chamber 13. A side duct 17 carries the resulting hot gases away for steam raising and electricity generation while the solid residues pass through a cooling chamber 18 to a collector 19.

Figure 3:
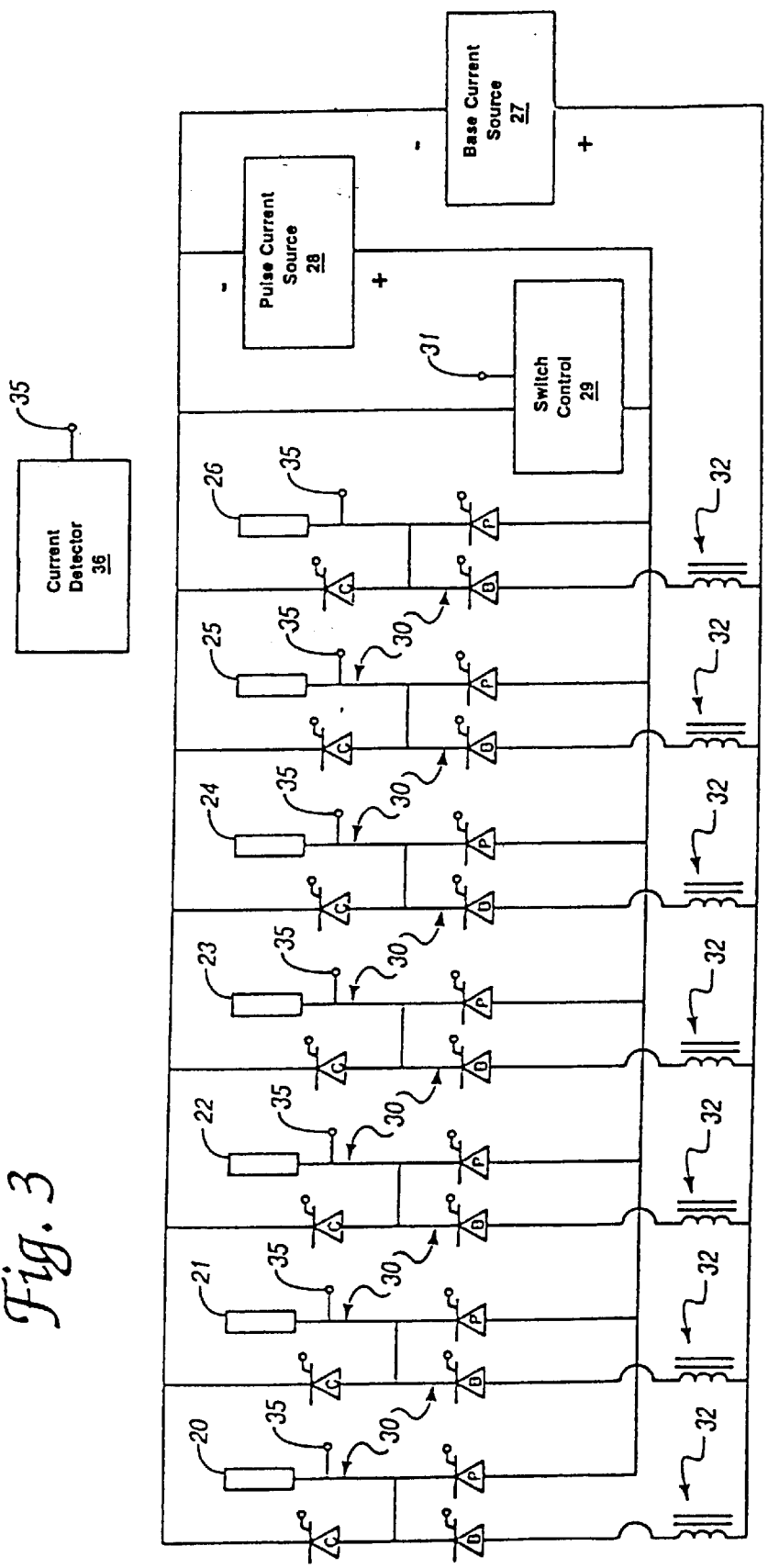
FIG. 3 is a schematic diagram showing a preferred control circuit in accordance with the present invention.

The reactor illustrated in FIG. 1 is, in the general terms described, similar to that illustrated in FIG. 3 of the incorporated patent and has the same breadth of application as described in the incorporated patent.

Figure 2:
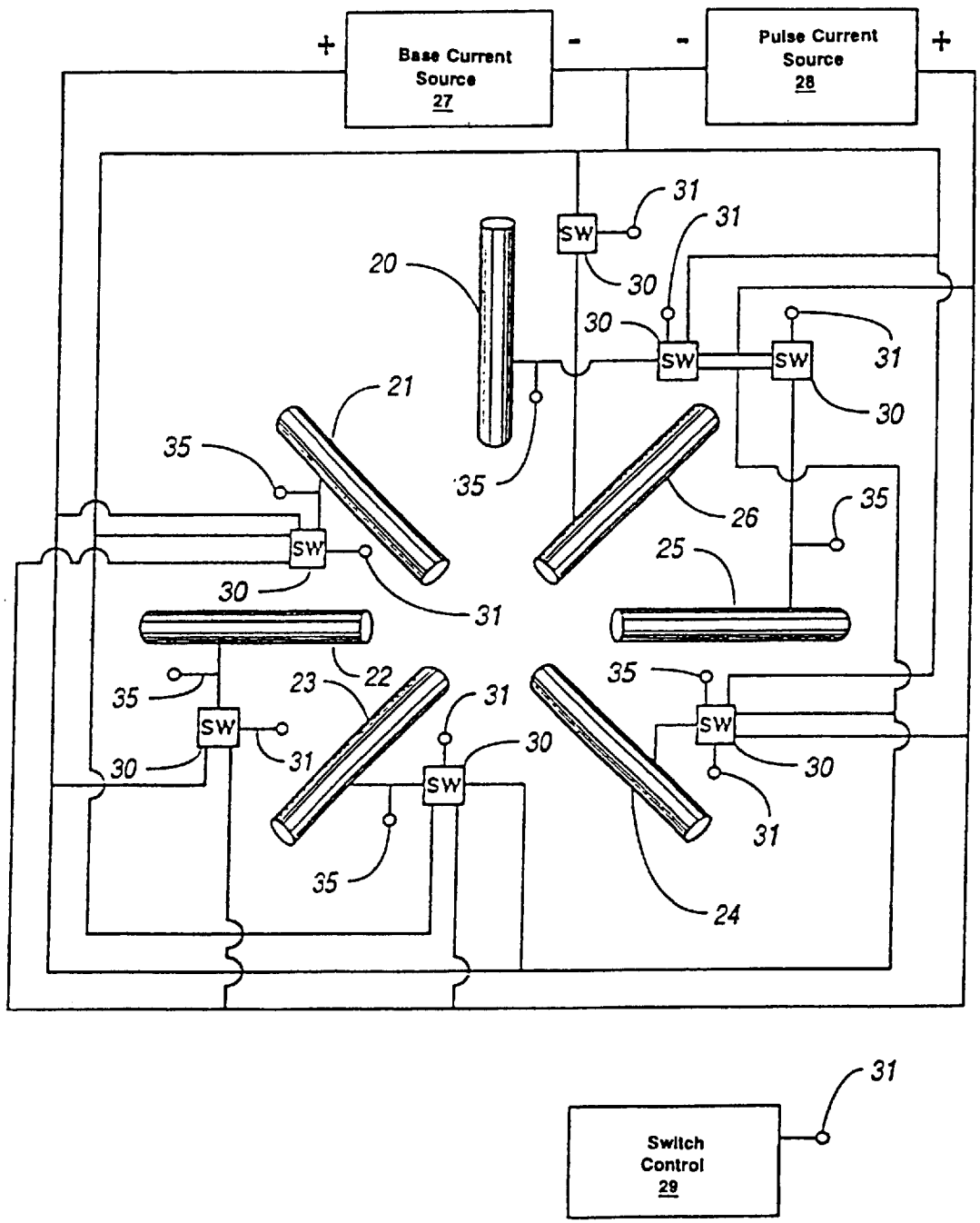
FIG. 2 is a schematic illustration of a preferred electrode configuration in accordance with the present invention and their control.

Referring now to FIG. 2, there is shown an axial electrode structure 20 as may be contained in the modular head 12 of the reactor of FIG. 1 and a plurality of electrode structures 21–26 which may be circularly arranged about the longitudinal center axis of the electrode assembly section 14 of the reactor of FIG. 1. In the illustrated embodiment of FIG. 2, there are six electrode structures 21–26 which, in accordance with the present invention, may be simple rod shaped structures, graphitic or metallic, for example, to which a series of pulse charges are applied as described hereinafter. Similarly, in accordance with the present invention, the electrode 20 may be a simple rod structure similar to the electrodes 21–26. Each of the electrodes 20–26 is connected to a base current source 27 and a pulse current source 28 by associated switches 30 controlled via Switch Control 29. Preferred implementations of the switches 30 are discussed below with reference to FIGS. 3 and 4 and include control terminals, (represented by the terminal(s) 31 in FIG. 2) by which the potentials developed by base current source 27 and pulse current source 28 may be selectively applied between two or more of the electrodes 20–26, as described more fully below. The terminal(s) 31 may represent one or more control terminals as needed by a particular implementation. This is represented herein by the designation "terminal(s)". Terminal(s) 31 of Switch Control 29 are connected to the terminal(s) 31 associated with switches 30. Those connections are not shown for the sake of clarity but are within the skill of one ordinarily skilled in the art.

As described above, the central electrode 20 of FIG. 3 is axially arranged with regard to the electrodes 21–26 with the configuration of the electrodes 20–26 defining a treatment or reaction zone which coincides approximately with the inter-electrode space. As will be appreciated by those skilled in the art, the electrodes 20–26, and particularly the electrodes 21–26, may be arranged in any desired configuration or arrangement to define or establish any desired inter-electrode space (or any treatment/reaction zone) between themselves or between themselves and the electrode 20. Nominally, in the implantation discussed herein, the electrode 20 may be referred to as a cathode while the electrodes 21–26 may function as anodes or, selectively as cathodes, as described below. Indeed, in some implentations of the present invention each electrode may function, selectively, as anode or cathode. Further, while six electrodes 21–26 are shown, any number of electrodes similarly constructed and electrically connected may be provided in accordance with the desired application. Those electrodes connected to function selectively as anode or cathode are sometimes referred to herein as variable polarity electrodes.

In operation, the switch 30 associated with electrode structure 20 is controlled, via its associated terminal(s) 31 and Switch Control 29, to connect the negative terminal of Base Current Source 27 to the electrode structure 20. Concurrently, one or more of the switches 30 associated with electrode structures 21–26 (and typically all of the electrode structures 21–26) are selectively controlled, via their associated control terminal(s) 31 and Switch Control 29, to connect the positive terminal of Base Current Source 29 to the selected ones of the electrode structures 21–26. The output of Base Current Source 29 is selected and controlled, in known manner, to establish a base current and thereby preionize the inter-electrode space. Of course, it is within the scope of the present invention to condition the inter-electrode space by preionizing in any known manner. This conditioning (by preionizing, for example) permits electrical discharges between selected electrode structures with practical potential differences. Such discharges are provided by selective application of pulses from Pulse Current Source 28 across the electrode structures 20–26 in a manner described more fully below. As will be apparent to those familiar with the art, sequential discharges between electrodes 20–26 will "condition" the inter-electrode space by maintaining an ionization level and may permit the base current to be discontinued during continued operation.

Any of the electrode structures 20–26 may function as a cathode with regard to the electrical discharges. Thus, it is apparent that selective control of the switches 30 allows the control of electrical discharges such that those discharges extend throughout the inter-electrode space. This is described with reference to FIG. 5. As described above, the interaction of these discharges with particulate matter to be treated within the treatment zone and, in particular, the effects of microfields within that zone, result in interaction with plasma (plasma action) without the necessity to establish and maintain an expanded plasma in the manner of the prior art.

FIG. 3 illustrates a preferred control circuit, and in particular, a preferred implementation of the switches 30 of FIG. 2. Throughout the several figures, like reference numerals are used to designate like elements. In the illustrated embodiment, the switches 30 are formed by one or more gate turn-off thyristors (GTO). It is to be understood, however, that other semiconducting power switches may be employed to implement the present invention, including bipolar junction transistors, MOSFET technology and other thyristors to provide current pulses. In the embodiment of FIG. 3, suitable switching control circuitry (represented at 29) is connected to the GTO control electrode, as described above, and as illustrated in FIG. 4 with respect to switch 30, in known manner. In the discussion of the present invention, the various thyristors are described as being "on" (conducting) or "off" (nonconducting) with control circuitry 29 applying appropriate control signals to the control electrode of the GTO to achieve that state. The switch 30 associated with each of the electrodes 20–26 is formed of three GTO's labeled "C" (for cathode), "P" (for pulse), and "B" (for base current). The positive output of the pulse current source 28 is connected to each of the GTO's labeled "P" while the positive output of base current source 27 is connected to each of the GTO's labeled "B" via magnetically linked inductors 32 which enhance current sharing, as will be understood by those skilled in the art.

In operation, and assuming a "conical" electrode configuration such as that shown in FIG. 2, the switch 30 associated with electrode 20 is controlled such that electrode 20 functions as a cathode. That is, the "C" GTO associated with electrode 20 is conducting and the associated "B" and "P" GTO are "off". The "C" GTO's associated with electrodes 21–26 are "off." Each of the "B" GTO's associated with electrodes 21–26 may be conducting such that current will flow between the "cathode" electrode 20 on one hand, and the "anode" electrodes 21–26 on the other. This current is selected to preionize the inter-electrode space and establish the conditions necessary for an arc discharge between the electrode 20 and the electrodes 21–26 at a practical potential difference. As noted above, preionization may, alternatively or in addition, be accomplished in any convenient manner.

With proper conditioning of the inter-electrode space (preionization established via Base Current Source 27 as described above, for example) an output from Pulse Current Source 28 will be applied to each of the "P" GTO's associated with electrodes 21–26. Under the control of Switch Control 29 one of the GTO's may be rendered "on" resulting in an arc discharge between its associated electrode 21–26 and the cathode electrode 20. It is apparent, that Switch Control 29 may be employed to establish a desired sequence of pulses (between the electrodes 21–26 and electrode 20) as will be described more fully below.

Terminals 35 are illustrated in FIGS. 3 and 4 in association with each of the electrodes 20–26. The terminals 35 may be employed in conjunction with a Current Detector 36 to detect the relative current between each or any of the electrodes 20–26 which are functioning as anode. Such current and associated voltage are representative of the loading of the feedstock being treated in the proximity to the relevant electrode. This information can be utilized for selection of firing order or other appropriate action which may depend on the relative loading conditions within the area or field of influence of a particular electrode. The connection between terminal 35 associated with each of the electrodes 20–26 is represented by the terminal 35 associated with Current Detector 36. The specific connections are not illustrated in FIG. 3 for the sake of clarity.

Referring now to FIG. 4, there is shown a modification to portions of the embodiment illustrated in FIG. 3 and, in particular, modifications to the switches 30 associated with each of the electrodes 20–26. As shown in FIG. 4, "C" GTO 40 corresponds to the "C" GTO of the switches 30 of FIG. 3 while "B" and "P" GTO's 41 and 42 correspond to the "B" and "P" GTO's, respectively. The terminals 43 and 44 may be connected to the negative and positive outputs of a Base Current Source such as that shown at 27 in FIG. 3, with the terminal 43 also being connected to the negative output of a Pulse Current Source such as that shown at 28 in FIG. 3. The terminal 45 in FIG. 4 may be connected to the positive output of a Pulse Current Source such as that shown at 28 in FIG. 3. The electrode 46 may represent any of the electrode structures 20–26 in FIG. 3.

To this point, the elements described in FIG. 4 correspond directly to those illustrated in FIG. 3 as does the connection of Current Detector 36 via terminal 35 and the control of the GTO's via Switch Control 29. In the modification of FIG. 4, the terminal 50 is adapted for connection to the negative output of an additional Pulse Current Source which may correspond in kind to that illustrated at 28 in FIG. 3, while the terminal 51 is adapted for connection to the positive output of that Pulse Current Source. The terminal 50 may also be connected to the negative output of a Base Current Source similar in kind to that illustrated at 27 in FIG. 3, while the negative output of that second Base Current Source is connected to the cathode electrode 20 in a manner which will be apparent to those familiar with the art. A second "C" GTO 52 is provided at terminal 50 while an additional "P" GTO 53 is provided at terminal 51. The GTO's 52 and 53 correspond in function to the GTO's 40 and 41 but are connected to second or additional Pulse Current Sources and Base Current Sources to provide a second set of pulses either as a supplement to the first set of pulses, as by being superimposed with them, or as a set of independent pulses.

Figure 5A:
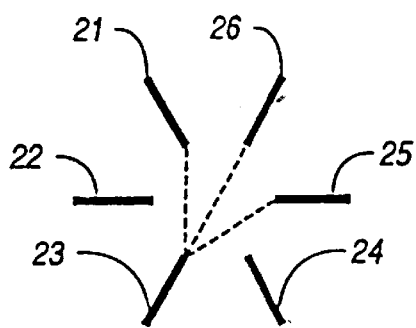
FIGS. 5A–5F are schematic diagrams illustrating a sequence of discrete electrical discharges throughout a treatment zone defined by spaced electrode structures.
Figure 5B:
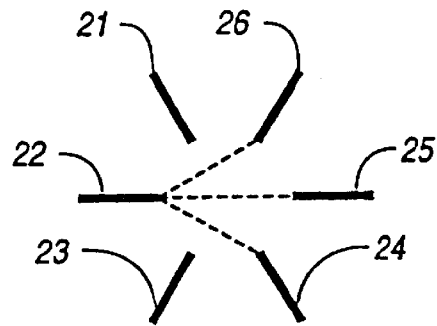
Figure 5C:
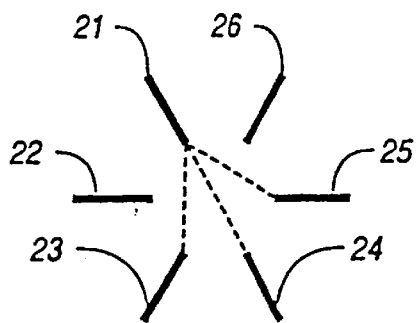
Figure 5D:
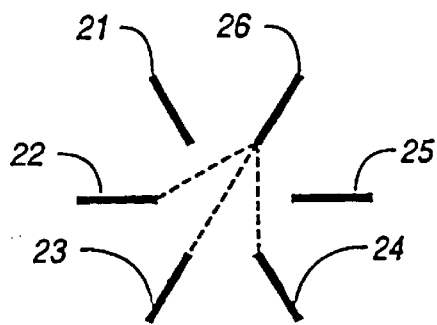
Figure 5E:
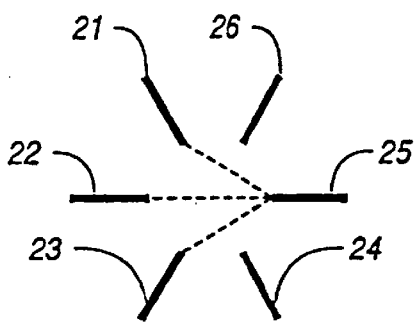
Figure 5F:
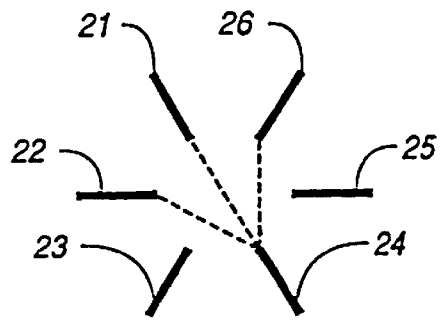

Referring now to FIGS. 5A–5F, there is diagrammatically illustrated a series of circularly arranged electrodes corresponding to the arrangement of electrode structures 21–26 of FIG. 2. In FIGS. 5A–5F, dashed lines extending between the electrode structures 21–26 represent discrete electrical discharges established by the control systems described above, and particularly the control system of FIG. 3. Assuming a properly conditioned (preionized) inter-electrode space, each, and any, of the electrodes 21–26 may be selected to function as a cathode with others selectively functioning as anodes. For example, in FIG. 5A electrode structure 23 is functioning as a cathode while electrode structures 21, 26, and 25 are sequentially functioning as anodes. That is, discrete electrical discharge is first established (via Pulse Current Source 28) between electrode (cathode) 23 and electrodes (anode) 21. The next pulse from Pulse Current Source 28, is applied between electrode 23 as cathode and electrode 26 as anode under the control of switch control 29. Similarly, the next pulse is applied between the electrode 23 as cathode and electrode 25 as anode. Thereafter, the switch control 29 may be operative to select electrode structure 22 as cathode and electrode structures 24–26 as anodes with a series of discrete electrical discharges cycling between those electrodes as represented in FIG. 5B. Essentially, the sequential firing represented in each of the FIGS. 5A–5F do not exist at the same time although there may be some overlap. Further, by selectively switching the cathode and anode electrodes through the sequence selected by FIGS. 5A–5F the entire volume of the inter-electrode space is subjected to an electrical discharge. Thus, particles within that volume are subjected to a treatment in accordance with the present invention. Of course, any firing sequence may be employed including multiple discharges generated by multiple pulse and base current sources as described above with reference to FIG. 4. Further, the electrode 20 may be employed (as cathode or anode) within a reactor in accordance with the present invention, while the inter-electrode space may be modified by movement of one or more of electrodes. Indeed, electrode configuration can be easily changed to any desired configuration dependent upon the particular application and the requirements of that application. The electrode configuration and firing sequence and timing are selected such that substantially the entire inter-electrode space is subjected to discrete electrical discharges within a time interval less, and preferably considerably less, than the expected residence time of particles to be treated within the inter-electrode space. This may be accomplished by a selected sequence of discrete electrical discharges in a time interval less, and preferably considerably less, than the transit time of particulate matter to be treated through the reaction zone of the inter-electrode space.

The table of FIG. 6 represents the conduction/nonconduction (on=X, of =0) for the firing sequence represented in FIG. 5A. In the table, the first row indicates the particular electrode structure, while row two indicates the particular "C", "B", and "P" GTO's associated with each electrode. Rows 3–5 of the table represent the first, second, and third pulses delivered by Pulse Current Source 28. An inspection of the table shows that the "C" GTO associated with the electrode 23 is on throughout the three pulses while the "C" GTO associated with the other electrodes is off. The "P" GTO associated with electrode 23 is off, while the "B" GTO associated with the other electrodes are on. This provides a base current via Base Current Source 27 between the cathode of electrode 23 and the other electrodes which serve as anodes. Concurrently with the first pulse from Current Pulse Source 28, the "P" GTO associated with electrode 21 is conducting (on) thereby applying a potential between the electrode structures 21 and 23 resulting in a discrete electrical discharge as represented by the dash line between those electrode structures in FIG. 5A. A second pulse from Current Pulse Source 28 finds the "P" GTO associated with electrode structure 21 off, while the "P" GTO associated with electrode structure 26 on. Thus, a discharge is applied between electrode structures 23 and 26 as represented by the dashed line between those electrode structures in FIG. 5A. The bottom line shows the state of the GTO's during the third pulse in the sequence resulting in an electrical discharge between the cathode of electrode structure 23 and the anode 25. Thereafter, any of the electrode structures 21–26 may be employed as a cathode with its associated "C" GTO turned on and its associated "P" GTO turned off. The "C" and "B" GTO's of the other electrode structures are in the opposite condition while the "P" GTO of the electrode it is desired to function as an anode is turned on concurrently with a pulse from the Current Pulse Source 28. Electrode structure 20 is capable, in the illustrated implantation, of functioning as cathode or anode dependent on the state of its associate "C", "B" and "P" GTO's.

It is apparent from this description that each of the electrode structures 20–26 can function alternatively as cathode or anode thereby exhibiting a variable polarity. Further, the discharges may follow any desired sequence utilizing one of the electrodes as cathode while the selection of electrodes as cathode can similarly may follow any desired sequence. As noted above, the electrodes may be positioned in any desired configuration and may be moveable, in known manner, to modify that configuration during operation or initial set-up. For example, the electrode configuration described above establishes an essentially conical inter-electrode space when the central cathode 20 is considered. Other, non-conical, configurations are contemplated by the present invention. Also, it has been observed that resonance phenomena, naturally occurring or induced, interacting with the entrained particles improve their treatment. In addition, treatment zones may be "stacked" (multiple treatment zones positioned sequentially in the particle path) with different zones having the same or different electrode configurations. In order to smooth the operation of a reactor in accordance with the present invention, a magnetic field coil, with an adjustable power supply may be provided in a manner known to those skilled in the art. Finally, particulate matter to be treated, and gases for plasma formation and/or stabilization, may be introduced into the reaction zone in any known manner, in accordance with the teachings of the incorporated patent, for example. It is therefore to be understood, that any configuration of electrodes consistent with the treatment of particulate matter by plasma action through the utilization of discrete electrical discharges is within the scope of the present invention as described in the appended claims.

What is claimed is:

1. In a reactor for the treatment of particulate matter by electrical discharge within a conditioned treatment zone which comprises:

means for passing particulate matter to be treated through the treatment zone;

means for subjecting the whole of said treatment zone to a sequence of discrete electrical discharges in a time interval considerably less than the transit time of particulate matter through said treatment zone, said discrete electrical discharges subjecting means comprising means for selecting the sequence of discrete electrical discharges, a plurality of spaced electrode structures and means for selectively applying non-sinusoidal pulses between said electrode structure;

means for selectively establishing a base current between said electrode structures; and means for detecting said base current and means responsive to said base current detecting means for selecting the electrode structures between which said pulses are applied.

* * * * *